(12) United States Patent
Chao et al.

(10) Patent No.: US 7,975,208 B2
(45) Date of Patent: Jul. 5, 2011

(54) METHOD AND APPARATUS FOR HIGH SPEED OPTICAL RECORDING

(75) Inventors: Ming-Yang Chao, Chu-Tung (TW); Ching-Wen Hsueh, Luodong (TW)

(73) Assignee: Mediatek Inc., Hsin-Chu (TW)

(*) Notice: Subject to any disclaimer, the term of this patent is extended or adjusted under 35 U.S.C. 154(b) by 1202 days.

(21) Appl. No.: 11/643,296

(22) Filed: Dec. 21, 2006

(65) Prior Publication Data

US 2008/0155377 A1   Jun. 26, 2008

(51) Int. Cl.
G11B 20/18  (2006.01)
(52) U.S. Cl. .................................................. 714/769
(58) Field of Classification Search .................. 714/755, 714/769
See application file for complete search history.

(56) References Cited

U.S. PATENT DOCUMENTS

| | | | |
|---|---|---|---|
| 5,940,358 A | 8/1999 | Kato | |
| 6,795,385 B2 | 9/2004 | Nishimura et al. | |
| 6,795,893 B2 | 9/2004 | Wu et al. | |
| 6,842,411 B2 | 1/2005 | Shin | |
| 7,055,082 B2* | 5/2006 | Mori et al. | 714/768 |
| 7,355,936 B2* | 4/2008 | Senshu | 369/47.24 |
| 7,463,818 B2* | 12/2008 | Ichinose et al. | 386/94 |
| 7,590,042 B2* | 9/2009 | Ide | 369/59.24 |
| 7,599,279 B2* | 10/2009 | Kim et al. | 369/275.3 |
| 7,698,515 B2 | 4/2010 | Hwang et al. | |
| 7,765,233 B2* | 7/2010 | Park | 707/791 |
| 2002/0024901 A1 | 2/2002 | Nishimura et al. | |
| 2002/0083225 A1 | 6/2002 | Wu et al. | |
| 2005/0055622 A1 | 3/2005 | Tsukamizu | |
| 2005/0210045 A1 | 9/2005 | Park | |
| 2006/0077841 A1 | 4/2006 | Lin et al. | |
| 2006/0107172 A1 | 5/2006 | Hsueh et al. | |
| 2006/0123283 A1 | 6/2006 | Hwang et al. | |
| 2006/0282614 A1 | 12/2006 | Shieh et al. | |
| 2008/0192597 A1 | 8/2008 | Hwang et al. | |

FOREIGN PATENT DOCUMENTS

| | | |
|---|---|---|
| CN | 1760980 A | 4/2004 |
| CN | 1591658 A | 3/2005 |
| JP | 2002-63768 | 2/2002 |

(Continued)

OTHER PUBLICATIONS

Office Action issued by the China State Intellectual Property Office on Jul. 31, 2009 in counterpart Chinese patent application No. 200710104420.4.
Zhijun Lei, "Blu-ray Disc Encoding", CHINAMEDIATECH, vol. 6, pp. 20-25 and 52, Dec. 31, 2003.

(Continued)

*Primary Examiner* — Stephen M Baker
(74) *Attorney, Agent, or Firm* — Chen Yoshimura LLP (57) ABSTRACT

An optical storage medium recording apparatus is provided a data preparing and ECC encoding circuit that both prepares the data by combining different categories of data into data sequences in accordance with a data layout on the optical storage medium and encodes the combined data. The encoded data is temporarily stored in a data buffer, and subsequently successively read out by a recording circuit for recording onto the optical storage medium according to the data layout. For a Blu-ray disc recording apparatus, the data preparing and ECC encoding circuit includes a LDC/BIS encoder for generating long distance error correction codes (LDC) and burst indicator subcodes (BIS) from the combined data to form LDC and BIS encoded data, which is temporarily stored in the data buffer. The recording circuit includes an interleave circuit for interleaving the LDC and BIS data to form physical clusters for recording on the disc.

15 Claims, 6 Drawing Sheets

FOREIGN PATENT DOCUMENTS

| | | |
|---|---|---|
| TW | 200634774 | 10/2006 |
| TW | 200641814 | 12/2006 |
| TW | 200643929 | 12/2006 |
| TW | I268483 | 12/2006 |

OTHER PUBLICATIONS

Taiwanese Office Action, dated Jan. 28, 2011, in a counterpart Taiwanese patent application, No. TW 096112854.

* cited by examiner

METHOD AND APPARATUS FOR HIGH SPEED OPTICAL RECORDING

BACKGROUND OF THE INVENTION

1. Field of the Invention

This invention relates to a method and apparatus for optical recording, and more particularly, to a method and apparatus for recording data on a Blu-ray disk.

2. Description of the Related Art

Conventional optical disks, such as digital versatile disks (DVD) or video compact disks (VCD), are extensively used in business activities or family life. They are usually used to store a mass of video, audio or other digital data, such as movies, music files, application software, etc. In order to make the optical disks capable of having a larger storage capacity, a standard for Blu-ray disks has been defined recently to satisfy the future requirements of users, in which a Blu-ray disk has a storage capacity more than five times greater than that of a DVD.

Figure 4:
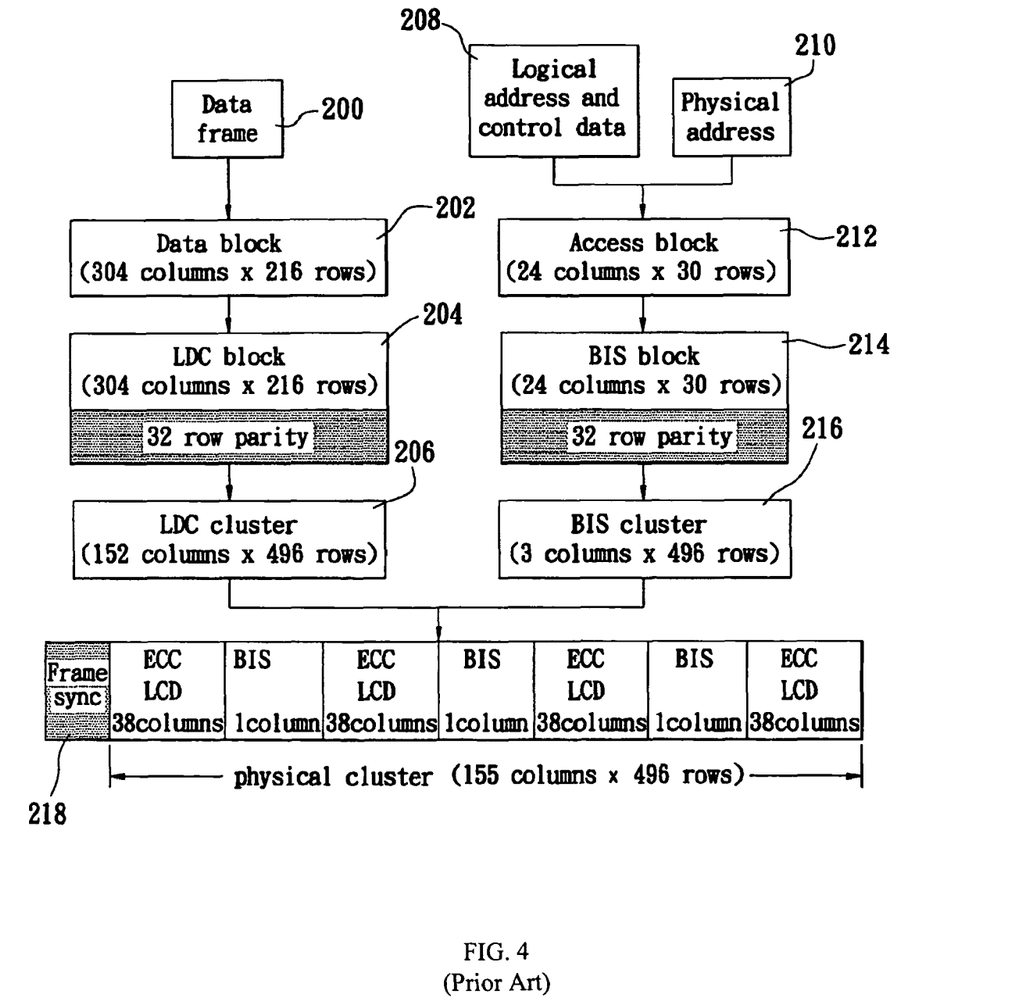
FIG. 4 illustrates the encoding process and data layout of a Blu-ray disk according to existing technologies.

Reference is made to FIG. 4, which is a flowchart diagram that illustrates the encoding process for a Blu-ray disk. Firstly, a means of encoding a Blu-ray disk divides the user data into frames, each of which has 2048 data bytes and 4 bytes of error detection codes (EDC). 32 frames of the user data is taken to form a data frame 200. The data frame 200 is re-arranged to form a data block 202, which is a data matrix with 304 columns and 216 rows. Before being re-arranged, every frame of the user data is scrambled to form a scrambled data frame. Thereafter, the encoding means generates 32 parity rows of long distance error correction codes (LDC) for every data block 202 to form a LDC block 204. Every column of the LDC block 204 is a LDC code. Hence, one LDC block 204 has 304 LDC codes. Subsequently, the LDC block 204 is re-arranged to form a LDC cluster 206, which is a data matrix with 152 columns and 496 rows. In the re-arranging process, the LDC block 204 is interleaved twice to reduce burst errors.

On the other hand, to facilitate data accessing, the logical address and control data 208 and physical address 210 are added in the encoding process, and the data and addresses are also encoded. For every user frame 200, the encoding means will provide the logical address and control data 208 of 32×18 bytes and the physical address 210 of 16×9 bytes. In the encoding process, the logical address and control data 208 and the physical address 210 are combined and re-arranged to form an access block 212, which is a data matrix with 24 columns and 30 rows. Thereafter, the encoding means generates 32 parity rows of the burst indicator subcodes (BIS) for the access block 212 to form a BIS block 214. Every BIS block 214 is re-arranged to form a BIS cluster 216, which is a data matrix with 3 columns and 496 rows. In the re-arranging process, the BIS block 214 is interleaved once.

After the LDC cluster 206 and the BIS cluster 216 are formed, the encoding means divides the LDC cluster 206 into four equal parts and divides the BIS cluster 216 into three equal parts. Thereafter, the encoding means inserts the parts of the BIS cluster 216 into the LDC cluster 206 and provides a frame sync to form a physical cluster 218. Lastly, the encoding means modulates the data of the physical cluster 218 and proceeds with the recoding procedure to form an error correction modulation block on the optical disk. The above data sequence and encoding are required by the Blu-ray standard.

SUMMARY OF THE INVENTION

The present invention is directed to an improved optical storage medium recording method and apparatus, and in particular, an improved recording method and apparatus for Bur-ray discs.

An object of the present invention is to provide such a recording apparatus with increased performance and reduced bandwidth demand on the data buffer.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides an optical storage medium recording apparatus, which includes: a data preparing and ECC encoding circuit for combining different categories of data into data sequences in accordance with a data layout on the optical storage medium and for encoding the combined data; a data buffer controller for storing the encoded data into a data buffer; and a recording circuit for successively reading out the encoded data from the data buffer through the data buffer controller and writing data on the optical storage medium according to the data layout on the optical storage medium. In one embodiment for a Blu-ray disc recording apparatus, the data preparing and ECC encoding circuit includes a LDC/BIS encoder for generating long distance error correction codes (LDC) and burst indicator subcodes (BIS) for the combined data.

In another aspect, the present invention provides an optical storage medium recording method, which includes: combining different categories of data into data sequences in accordance with a data layout on the optical storage medium; encoding the combined data; storing the encoded data into a data buffer; successively reading out the encoded data from the data buffer; and writing data on the optical storage medium according to the data layout on the optical storage medium. In one embodiment for a Blu-ray disc recording method, the encoding step includes generating long distance error correction codes (LDC) and burst indicator subcodes (BIS) for the combined data.

It is to be understood that both the foregoing general description and the following detailed description are exemplary and explanatory and are intended to provide further explanation of the invention as claimed.

BRIEF DESCRIPTION OF THE DRAWINGS

FIGS. 5($a$) and 5($b$) illustrate an apparatus for recording data on an optical storage medium such as a DVD according to existing technologies.

DETAILED DESCRIPTION OF THE PREFERRED EMBODIMENTS

Figure 5A:
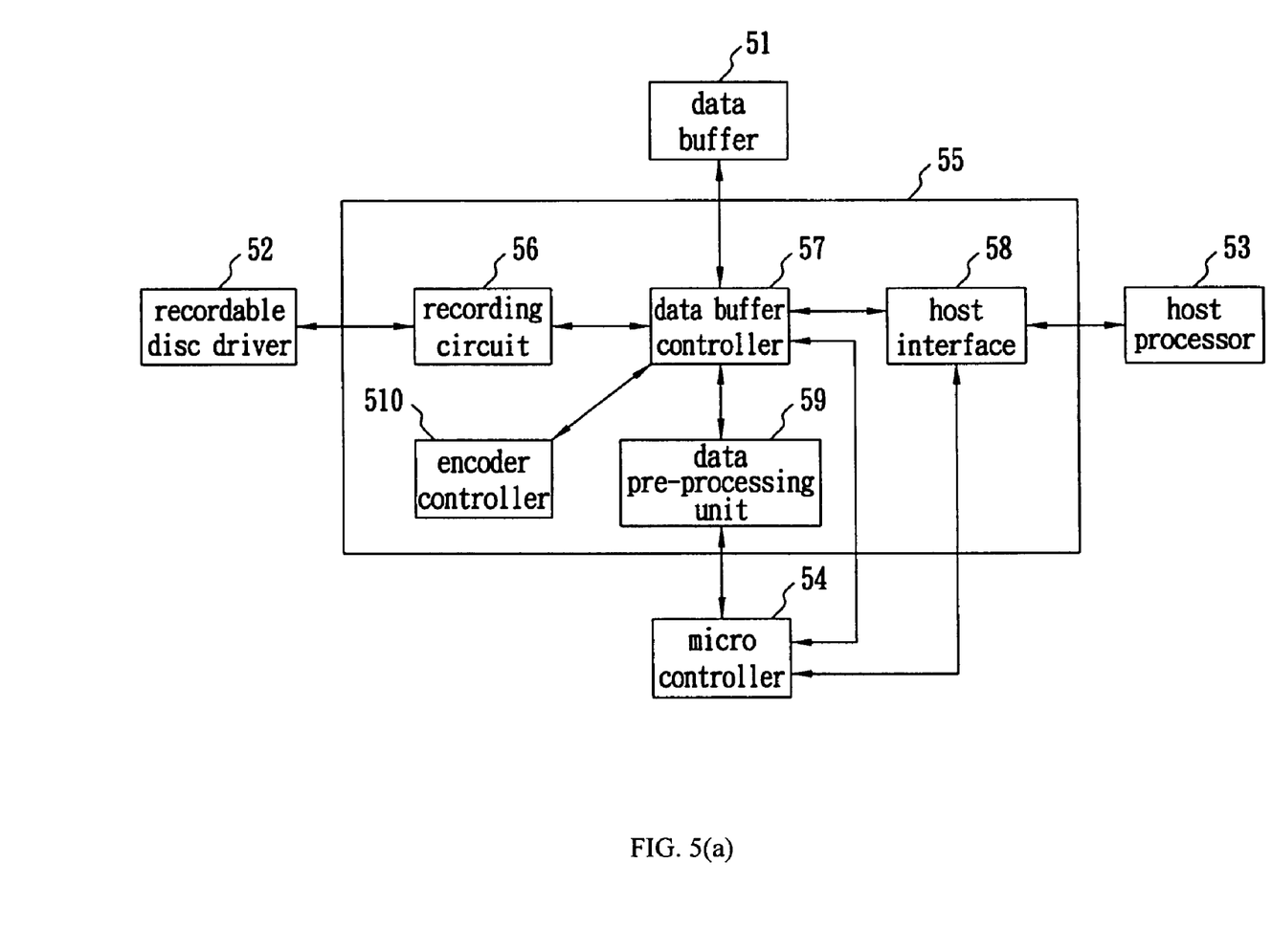
Figure 5B:
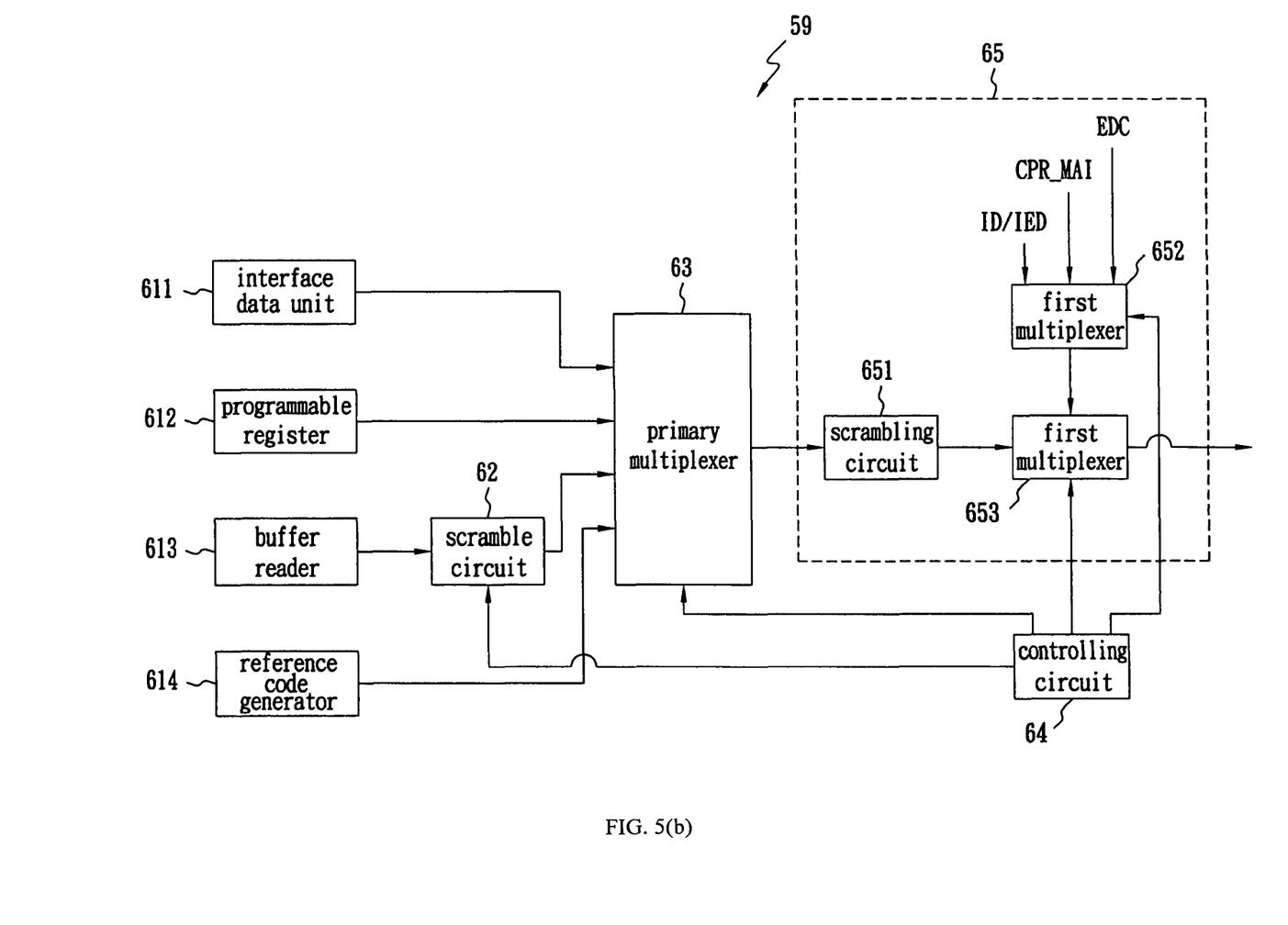

A recording apparatus for an optical storage medium typically utilizes a data buffer (such as a DRAM or other suitable memories) to temporarily store data to be recorded on the optical storage medium. In a recording apparatus for a digital versatile disc (DVD) described in commonly owned U.S. Patent Application Publication No. 2006/0077841A1, filed Sep. 30, 2005, published Apr. 13, 2006, a data pre-processing circuit was proposed, which prepares the data before storing it in the data buffer such that the data to be recorded on the DVD are successively stored in the data buffer in accordance with the data sequence on the DVD, including the identification data of data sectors. As a result, a recording circuit can read out the prepared data from the data buffer in accordance with the sequence of corresponding identification data and write them to corresponding tracks on the optical storage medium. FIGS. 5(a) and 5(b) illustrate the recording apparatus described in the aforementioned commonly owned patent application (corresponding to FIGS. 5 and 6 thereof). The recording apparatus 55 includes a host interface 58 (e.g. IDE or SCSI interface) for receiving data signals and commands from a host processor 53. After a data buffer controller 57 receives commands from the host interface 58, the micro controller 54 sends commands to data pre-processing unit 59 to generate different types of main data and sector header, and buffer to data buffer 51. The data processed by the data pre-processing unit 59 (the prepared data) are temporarily stored in the data buffer 51 according to the sequence of writing the corresponding data to the disc. An encoder controller 510 sequentially reads the prepared data stored in the data buffer 51 for encoding (e.g., cross-interleaved Reed-Solomon channel coding) to form error correction code (ECC) blocks. A recording circuit 56 sequentially reads the encoded data and sends out commands to control the recordable disc driver 52.

As explained in the aforementioned commonly owned patent application, data to be written on optical storage media (e.g. a DVD) fall into the following four categories: (1) data received from a host through an interface; (2) successive bytes of data belonging to an identical matter, for example, the similar data to be recorded on a reserved zone, a buffer zone 1 or a buffer zone 2 of a DVD; (3) data read from a data buffer, for example, the control data to be written to a control data zone or the data read from the optical storage media; and (4) data including special patterns, for example, the data to be written to a reference code zone. FIG. 5(b) is a schematic diagram of the circuit for the data pre-processing unit 59 of FIG. 5(a). The data pre-processing unit 59 includes four data prepare units 611 through 614 to combine the different categories of data described above. Before the combined data are stored in the data buffer, they are also combined with identification data (ID), ID error detection code (IED), copyright management information (CPR_MAI), and error detection code (EDC) for each data sector.

As discussed in earlier, data encoding for a Blu-ray disc recording includes LDC and BIS encoding. If the design of the DVD recording apparatus described in the aforementioned commonly owned patent application were applied to a Blu-ray recording apparatus, the encoding process would include the following steps. First, the host interface receives user data from the host, and a data prepare circuit performs scrambling, ID error detection coding (IED) and error detection coding (EDC), adds address unit numbers (AUNs) to the user data, and stores the prepared data in the data buffer. This would be analogous to the data preparing step performed by the data pre-processing unit 59 in the DVD recording apparatus shown in FIGS. 5(a) and 5(b). Second, an encoding circuit reads the prepared data from the data buffer, performs LDC and BIS encoding, and writes the LDC and BIS clusters into the data buffer as coded data. This would be analogous to the encoding step performed by the encoder controller 510 in the DVD recording apparatus shown in FIG. 5(a). Third, a recording circuit reads the coded data from the data buffer, and performs interleaving and modulation and then records the signal onto the Blu-ray disc. This would be analogous to the function performed by the recording circuit 56 in the DVD recording apparatus shown in FIG. 5(a). It can be seen that such a process would require accessing the data buffer three times.

Figure 1:
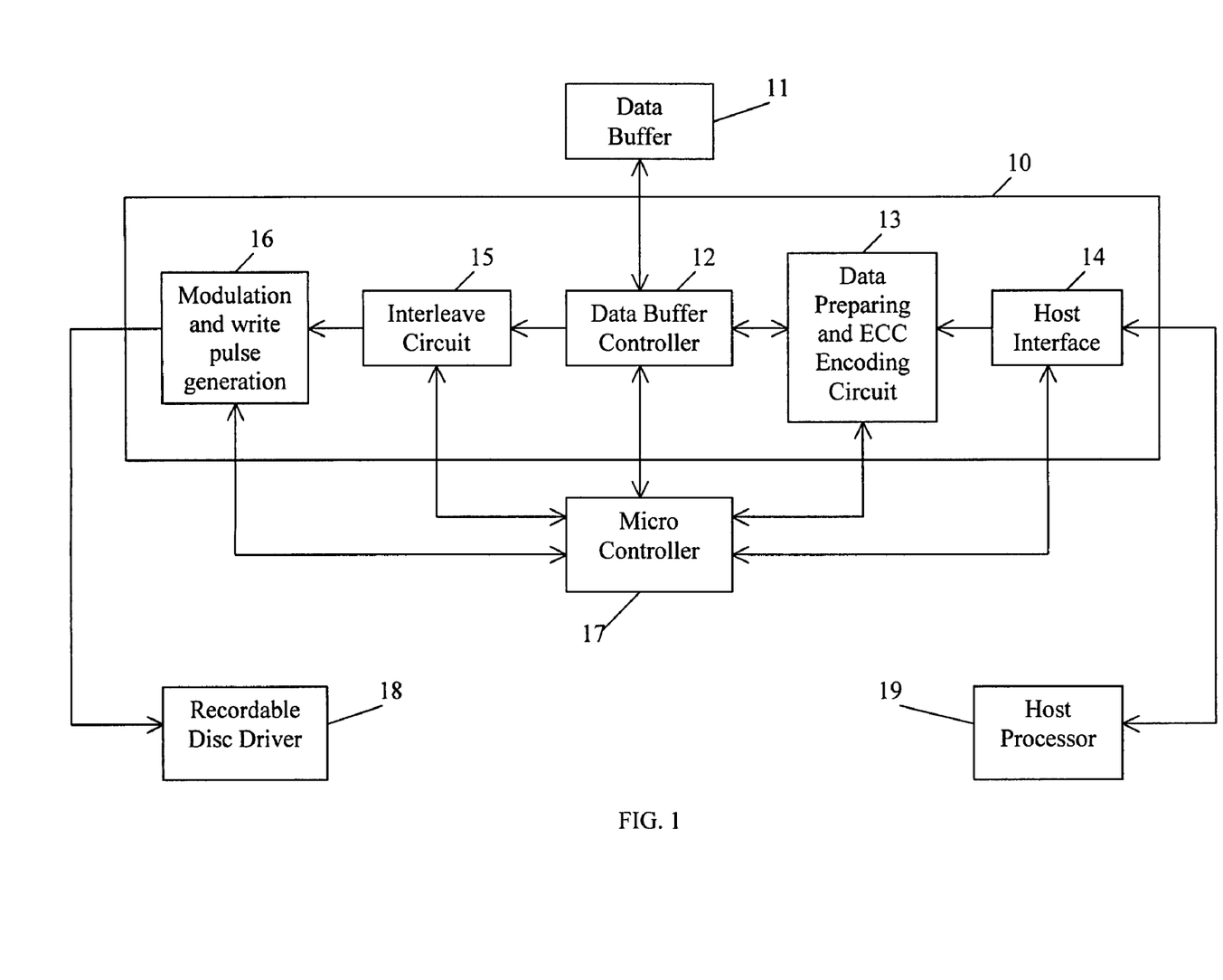
FIG. 1 is a block diagram illustrating an optical storage medium recording apparatus according to an embodiment of the present invention.
Figure 2:
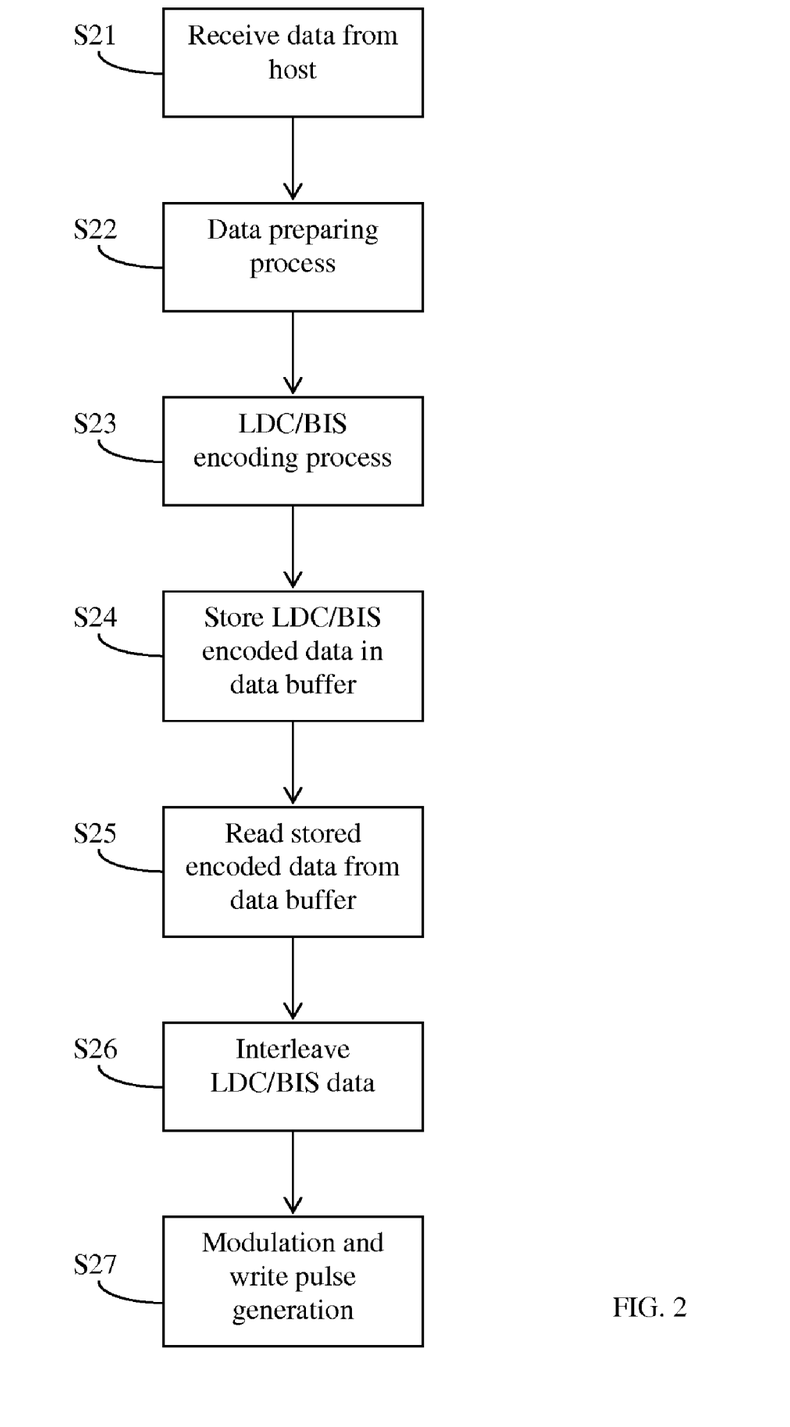
FIG. 2 is a flow chart illustrating a method of recording data on an optical storage medium according to an embodiment of the present invention.

To enhance the performance of a Blu-ray disc recording apparatus, embodiments of the present invention provide a data preparing and ECC (error correction code) encoding circuit that performs both data preparing functions and LDC and BIS encoding functions. As a result, a second step of reading the prepared data from the data buffer in order to perform LDC and BIS encoding is not necessary, thus reducing the number of times the data buffer is accessed to read or write the user data from three to two. FIG. 1 illustrates an optical storage medium recording apparatus, and FIG. 2 illustrates a process of recording data on an optical storage medium, according to embodiments of the present invention. As shown in FIG. 1, a host interface 14 communicates data and commands with a host processor 19 (see step S21 in FIG. 2). The host interface 14 may be, for example, an IDE/SATA or a SCSI interface. The user data received from the host processor 19 is processed by a data preparing and ECC encoding circuit 13, which performs data preparing functions and LDC and BIS encoding functions. As shown in more detail in FIG. 3, the data preparing and ECC encoding circuit 13 combines various categories of data, including data received from the host processor 19, data from programmable registers, data from a data buffer (either the data buffer 11 or a separate data buffer) such as user control data, data from AF (address field) counter, etc., into data sequences in accordance with the data layout on the optical disc. In other words, the data are combined into data sequences that, when LDC and BIS encoded, will form the LDC and BIS blocks described earlier. To this end, the data preparing and ECC encoding circuit 13 includes an EDC generator to generate error detection codes (EDC) on the data; it also scrambles and descrambles various data as appropriate. This process may be referred to as the data preparing process (step S22 in FIG. 2). After the various categories of data are combined into appropriate data sequences, an LDC/BIS encoder 20 of the data preparing and ECC encoding circuit 13 generates LDC and BIS parity data to form the LDC blocks and BIS blocks (refer to FIG. 4). This step may be referred to as the LDC/BIS encoding process (step S23 in FIG. 2). The LDC and BIS blocks are then stored as encoded data in the data buffer 11 via the data buffer controller 12 (step S24 in FIG. 2). Alternatively, the data preparing and ECC encoding circuit 13 may additionally perform the steps of rearranging the LDC blocks to form LDC clusters and rearranging the BIS blocks to form BIS clusters. In such a case, the LDC clusters and BIS clusters are stored in the data buffer 11 as the encoded data.

Figure 3:
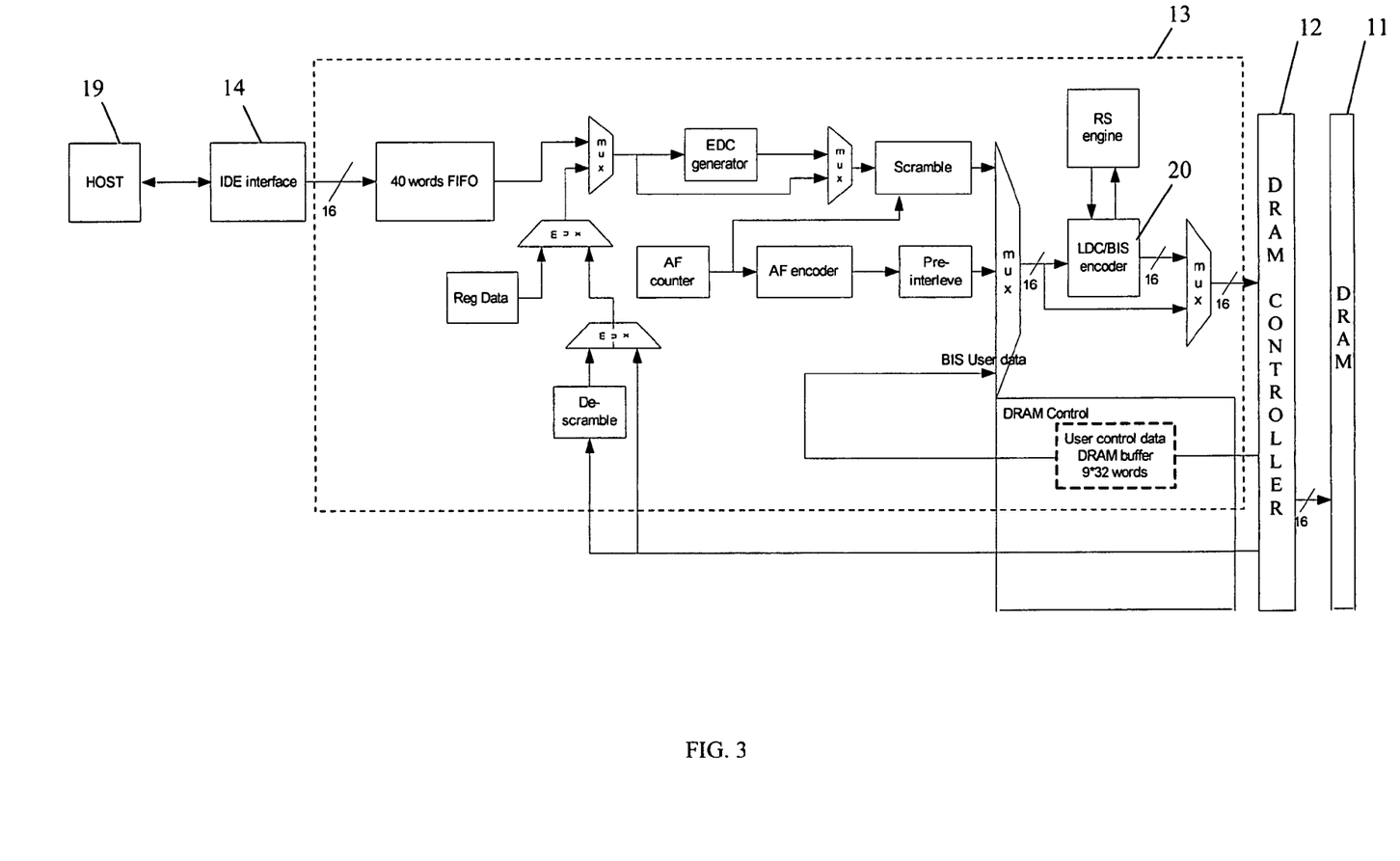
FIG. 3 illustrates an exemplary data prepare and ECC encoding unit of FIG. 1.

It should be noted that the structure shown in FIG. 3 is only an exemplary structure of a data preparing and ECC encoding circuit 13 of the optical storage medium recording apparatus of FIG. 1. Many variations of this circuit may be implemented, so long as the circuit performs both data preparing functions (i.e. combines data from various sources to generate data sequences in accordance with the data layout on the optical disc) and LDC and BIS encoding functions.

The encoded LDC/BIS blocks stored in the data buffer 11 are subsequently read out by the data buffer controller 12 (step S25 in FIG. 2), and sent to an interleave circuit 15. The interleave circuit 15 rearranges the LDC block to form LDC clusters, rearranges BIS blocks to form BIS clusters, and performs interleaving of the columns of the LDC and BIS clusters (step S26 in FIG. 2) to form physical clusters (see FIG. 4) for recording onto the Blu-ray disc. Alternatively, if the LDC and BIS blocks have already been rearranged into LDC and BIS clusters by the data preparing and ECC circuit 13, then the interleave circuit 15 does not perform the steps of rearranging the LDC and BIS blocks. The modulation and write pulse generation circuit 16 performs modulation and generates commands to control the recordable disc driver 18 to record data onto the disc (step S26 in FIG. 2). The interleave circuit 15 and the modulation and write pulse generation circuit may be collectively referred to as a recording circuit. The various circuits 12, 13, 14, 15 and 16 are controlled by a microcontroller 17.

An advantage of embodiments of the present invention is that they reduce the data buffer access for reading and writing user data from three times to two time, which results in a significant reduction in the bandwidth demand on the data buffer and improvement in processing speed.

Although the optical storage medium recording method and apparatus have been described above using Blu-ray disc as an example, the method and apparatus can be applied to other types of optical storage medium with appropriate modifications of the data preparing and ECC encoding circuit, the interleave circuit and other circuits.

It will be apparent to those skilled in the art that various modification and variations can be made in the optical storage media recording method and apparatus of the present invention without departing from the spirit or scope of the invention. Thus, it is intended that the present invention cover modifications and variations that come within the scope of the appended claims and their equivalents.

What is claimed is:

1. An optical storage medium recording apparatus comprising:
   a data preparing and ECC encoding circuit for combining different categories of data into data sequences in accordance with a data layout on the optical storage medium and for encoding the combined data;
   a data buffer controller for storing the encoded data generated by the data preparing and ECC encoding circuit into a data buffer; and
   a recording circuit for successively reading out the encoded data from the data buffer through the data buffer controller and writing the encoded data on the optical storage medium according to the data layout on the optical storage medium.

2. The optical storage medium recording apparatus of claim 1, wherein the different categories of data combined by the data preparing and ECC encoding circuit include data received from a host processor, data from programmable registers, data from the data buffer, and data from an address field counter.

3. The optical storage medium recording apparatus of claim 1, wherein the optical storage medium is a Blu-ray disc.

4. The optical storage medium recording apparatus of claim 1, wherein the data preparing and ECC encoding circuit includes a LDC/BIS encoder for generating long distance error correction codes (LDC) and burst indicator subcodes (BIS) for the combined data to form LDC and BIS encoded data, and wherein the data buffer controller stores the LDC and BIS encoded data in the data buffer.

5. The optical storage medium recording apparatus of claim 4, wherein the LDC and BIS encoded data include LDC blocks and BIS blocks.

6. The optical storage medium recording apparatus of claim 4, wherein the LDC and BIS encoded data include LDC clusters and BIS clusters.

7. The optical storage medium recording apparatus of claim 4, wherein the recording circuit includes an interleave circuit for interleaving the LDC and BIS encoded data read out from the data buffer to generate physical clusters for recording onto the optical storage medium.

8. An optical storage medium recording method comprising:
   combining different categories of data into data sequences in accordance with a data layout on the optical storage medium;
   encoding the combined data;
   storing the encoded data into a data buffer;
   successively reading out the encoded data from the data buffer; and
   writing the encoded data on the optical storage medium according to the data layout on the optical storage medium.

9. The optical storage medium recording method of claim 8, further comprising receiving data from a host processor before the combining step.

10. The optical storage medium recording method of claim 8, wherein in the combining step, the different categories of data include data received from the host processor, data from programmable registers, data from the data buffer, and data from an address field counter.

11. The optical storage medium recording method of claim 8, wherein the optical storage medium is a Blu-ray disc.

12. The optical storage medium recording method of claim 8, wherein the encoding step includes generating long distance error correction codes (LDC) and burst indicator subcodes (BIS) for the combined data to form LDC and BIS encoded data, and wherein the storing step includes storing the LDC and BIS encoded data in the data buffer.

13. The optical storage medium recording method of claim 12, wherein the LDC and BIS encoded data include LDC blocks and BIS blocks.

14. The optical storage medium recording method of claim 12, wherein the LDC and BIS encoded data include LDC clusters and BIS clusters.

15. The optical storage medium recording method of claim 12, wherein the reading step includes reading out the LDC and BIS encoded data, and wherein the writing step includes interleaving the LDC and BIS encoded data read out from the data buffer to generate physical clusters.

* * * * *